(12) United States Patent
Bootman

(10) Patent No.: US 10,995,267 B2
(45) Date of Patent: May 4, 2021

(54) DISPERSION SYSTEM FOR QUANTUM DOTS HAVING ORGANIC COATINGS COMPRISING FREE POLAR AND NON-POLAR GROUPS

(71) Applicant: Crystalplex Corporation, Pittsburgh, PA (US)

(72) Inventor: Matthew W. Bootman, McMurray, PA (US)

(73) Assignee: CRYSTALPLEX CORPORATION, Pittsburgh, PA (US)

( * ) Notice: Subject to any disclaimer, the term of this patent is extended or adjusted under 35 U.S.C. 154(b) by 0 days.

(21) Appl. No.: 14/725,658

(22) Filed: May 29, 2015

(65) Prior Publication Data

US 2015/0344776 A1 Dec. 3, 2015

Related U.S. Application Data

(60) Provisional application No. 62/004,712, filed on May 29, 2014.

(51) Int. Cl.

| | |
|---|---|
| *B32B 5/16* | (2006.01) |
| *C09K 11/88* | (2006.01) |
| *C09K 11/56* | (2006.01) |
| *C09K 11/02* | (2006.01) |

(Continued)

(52) U.S. Cl.
CPC ............ *C09K 11/883* (2013.01); *C09K 11/02* (2013.01); *C09K 11/025* (2013.01); *C09K 11/565* (2013.01); *H01L 33/501* (2013.01); *B82Y 20/00* (2013.01); *Y10S 977/774* (2013.01)

(58) Field of Classification Search
CPC ................................................ Y10T 428/2991
See application file for complete search history.

(56) References Cited

U.S. PATENT DOCUMENTS

| 5,260,124 A | 11/1993 | Gaier |
|---|---|---|
| 5,763,085 A | 6/1998 | Atarashi et al. |
| 5,958,591 A | 9/1999 | Budd |

(Continued)

FOREIGN PATENT DOCUMENTS

| CN | 102676174 A | 9/2012 |
|---|---|---|
| EP | 1790686 A2 | 5/2007 |

(Continued)

OTHER PUBLICATIONS

McBride et al., Structural Basis for Near Unity Quantum Yield Core/Shell Nanostructures, Nano Letters, 2006, vol. 6, No. 7, 1496-1501. (Year: 2006).*

(Continued)

*Primary Examiner* — Hoa (Holly) Le
(74) *Attorney, Agent, or Firm* — Troutman Pepper Hamilton Sanders LLP

(57) ABSTRACT

Disclosed herein are methods and compositions of nanoparticles having one or more layers of organic coating. In some embodiments, a nanoparticle comprises a core/shell nanocrystal comprising a first coating layer comprising a plurality of organic molecules, and a second organic coating layer surrounding the first organic coating layer, wherein the second coating layer comprises a plurality of organic molecules. Further, the organic molecules of the second coating layer are intercalated between the organic molecules of the first coating layer.

10 Claims, 1 Drawing Sheet

(51) Int. Cl.
*H01L 33/50* (2010.01)
*B82Y 20/00* (2011.01)

(56) References Cited

U.S. PATENT DOCUMENTS

| | | | |
|---|---|---|---|
| 6,057,396 | A | 5/2000 | Lan et al. |
| 6,207,280 | B1 | 3/2001 | Atarashi et al. |
| 6,322,901 | B1 | 11/2001 | Bawendi et al. |
| 6,423,551 | B1 | 7/2002 | Weiss et al. |
| 6,602,671 | B1 | 8/2003 | Bawendi et al. |
| 6,607,829 | B1 | 8/2003 | Bawendi et al. |
| 6,699,723 | B1 | 3/2004 | Weiss et al. |
| 6,815,064 | B2 | 11/2004 | Treadway et al. |
| 6,821,337 | B2 | 11/2004 | Bawendi et al. |
| 6,861,155 | B2 | 3/2005 | Bawendi et al. |
| 6,927,069 | B2 | 8/2005 | Weiss et al. |
| 7,056,471 | B1 | 6/2006 | Han et al. |
| 7,125,605 | B2 | 10/2006 | Bawendi et al. |
| 7,138,098 | B2 | 11/2006 | Bawendi et al. |
| 7,229,690 | B2 | 6/2007 | Chan et al. |
| 7,358,525 | B2 | 4/2008 | Lee |
| 7,611,750 | B2 | 11/2009 | Yi et al. |
| 7,777,233 | B2 | 8/2010 | Kahen et al. |
| 7,825,405 | B2 | 11/2010 | Kim et al. |
| 7,842,385 | B2 | 11/2010 | Jang et al. |
| 7,867,557 | B2 | 1/2011 | Pickett et al. |
| 7,981,667 | B2 | 7/2011 | Nie et al. |
| 8,017,235 | B2 | 9/2011 | Nakamura et al. |
| 8,106,292 | B2 | 1/2012 | Cumpston et al. |
| 8,343,575 | B2 | 1/2013 | Dubrow |
| 8,368,106 | B2 | 2/2013 | Jang et al. |
| 8,414,800 | B2 | 4/2013 | Jang et al. |
| 8,454,927 | B2 | 6/2013 | Qu et al. |
| 8,536,776 | B2 | 9/2013 | Wood et al. |
| 8,784,703 | B2 | 7/2014 | Kahen et al. |
| 8,847,197 | B2 | 9/2014 | Pickett et al. |
| 8,945,421 | B2 | 2/2015 | Lee et al. |
| 8,981,305 | B2 | 3/2015 | Holloway et al. |
| 9,054,329 | B2 | 6/2015 | Coe-Sullivan et al. |
| 9,199,842 | B2 | 12/2015 | Dubrow et al. |
| 9,205,420 | B2 | 12/2015 | Reece et al. |
| 9,425,253 | B2 | 8/2016 | Qu et al. |
| 9,570,549 | B2 | 2/2017 | Jang et al. |
| 2001/0023078 | A1 | 9/2001 | Bawendi et al. |
| 2006/0014315 | A1 | 1/2006 | Chan et al. |
| 2006/0028882 | A1 | 2/2006 | Qu |
| 2006/0036084 | A1 | 2/2006 | Qu |
| 2006/0040103 | A1 | 2/2006 | Whiteford et al. |
| 2007/0087197 | A1 | 4/2007 | Jang et al. |
| 2007/0111324 | A1 | 5/2007 | Nie et al. |
| 2007/0125984 | A1 | 6/2007 | Tian et al. |
| 2007/0200479 | A1 | 8/2007 | Jean et al. |
| 2008/0280161 | A1 | 11/2008 | Jang et al. |
| 2008/0296534 | A1 | 12/2008 | Lifshitz et al. |
| 2008/0311182 | A1 | 12/2008 | Ferrari et al. |
| 2009/0116753 | A1 | 5/2009 | Midgley et al. |
| 2009/0169866 | A1 | 7/2009 | Ostafin et al. |
| 2009/0202814 | A1 | 8/2009 | Jabado et al. |
| 2009/0321692 | A1 | 12/2009 | LoCascio et al. |
| 2010/0051901 | A1 | 3/2010 | Kazlas et al. |
| 2010/0140586 | A1 | 6/2010 | Char et al. |
| 2010/0167011 | A1 | 7/2010 | Dubrow |
| 2010/0252778 | A1 | 10/2010 | Murase et al. |
| 2010/0264371 | A1 | 10/2010 | Nick |
| 2010/0289003 | A1 | 11/2010 | Kahen et al. |
| 2011/0021970 | A1 | 1/2011 | Vo-Dinh et al. |
| 2011/0084250 | A1 | 4/2011 | Jang et al. |
| 2011/0233468 | A1 | 9/2011 | Zong et al. |
| 2013/0011339 | A1 | 1/2013 | Colvin et al. |
| 2014/0001405 | A1 | 1/2014 | Guo et al. |
| 2014/0005083 | A1 | 1/2014 | Malshe |
| 2014/0045323 | A1* | 2/2014 | Gonen Williams .... B82Y 30/00 438/478 |
| 2014/0140918 | A1 | 5/2014 | Breen et al. |
| 2014/0339497 | A1 | 11/2014 | Qu et al. |
| 2015/0268370 | A1* | 9/2015 | Johnston ................ B82Y 30/00 324/346 |
| 2017/0045524 | A1 | 2/2017 | Qu et al. |
| 2019/0177615 | A1 | 6/2019 | Qu et al. |

FOREIGN PATENT DOCUMENTS

| | | |
|---|---|---|
| EP | 2184333 A2 | 5/2010 |
| EP | 3561514 A1 | 10/2019 |
| WO | 2005001889 A2 | 1/2005 |
| WO | WO 2006/051153 A2 | 5/2006 |
| WO | WO 2006/134599 A1 | 12/2006 |
| WO | 2008140495 A2 | 11/2008 |
| WO | WO 2009/020436 A1 | 2/2009 |
| WO | WO 2009/026396 A1 | 2/2009 |
| WO | 2009035657 A1 | 3/2009 |
| WO | 2011038111 A1 | 3/2011 |
| WO | 2013039897 A2 | 3/2013 |
| WO | 2013114254 A2 | 8/2013 |
| WO | 2013191655 A1 | 12/2013 |
| WO | 2015184329 A1 | 12/2015 |

OTHER PUBLICATIONS

Extended European Search Report for EP 15798955.9 dated Jan. 4, 2018.
Foley et al. "Inhibition of Oxide Formation on Aluminum Nanoparticles by Transition Metal Coating." Chemistry of Materials, vol. 17, 2005, pp. 4086-4091. (Year: 2005).
Del-Valle et al. "Simple Fabrication and Characterization of an Aluminum Nanoparticle Monolayer with Well-Defined Plasmonic Resonances in the Far Ultraviolet." Metals, vol. 8 (67), 2018, pp. 1-14. (Year: 2018).
Shuhendler et al., Hybrid Quantum Dot—Fatty Ester Stealth Nanoparticles: Toward Clinically Relevant in Vivo Optical Imaging of Deep Tissue, ACS Nano (2011), 5(3) pp: 1958-1966.
Rosenthal et al., Biocompatible Quantum Dots for Biological Applications, Chemistry & Biology (Jan. 28, 2011), 18(1) pp. 10-24.
Extended European Search Report for EP 19163854.3 dated Sep. 19, 2019.
Lowe. "In the Pipeline—Trimethylaluminum Explosion in Massachusetts." http://blogs.sciencemag.org/pipeline/archives/2016/01/07/trimethylaluminum-explosion-in-massachusetts accessed Feb. 7, 2019, published Jan. 7, 2016, 15 pages.
Shahravan et al.; "Passivation of Aluminum Nanoparticles by Plasma-Enhanced Chemical Vapor Depostion for Energetic Nanomaterials." Applied Materials & Interfaces, vol. 6, 2014, p. 7942-7947.
Dave et al.: "Monodisperse magnetic nanoparticles for biodetection, imaging, and drug delivery: a versatile and evolving technology", Wiley Interdisciplinary Reviews: Nanomedicine and Nanobiotechnology, vol. 1, No. 6, Nov. 1, 2009 (Nov. 1, 2009), pp. 583-609.
Wu et al.: "Immunofluorescent labeling of cancer marker Her2 and other cellular targets with semiconductor quantum dots", Nature Biotechnology, vol. 21, No. 1, Dec. 2, 2002 (Dec. 2, 2002), pp. 41-46.
Chen et al., "ZnO/Al2O3 core-shell nanorod arrays: growth, structural, characterization, and luminescent properties," *Nanotechnology IOP*, Bristol, GB (May 6, 2009), 20(18):185605.
Extended European Search Report issued on European Patent Application No. 10819454.9 dated Feb. 26, 2016.
Law, et al., "ZnO-Al2O3 and ZnO—TiO2 Core-Shell Nanowire Dye-Sensitized Solar Cells," *J. Phys. Chem, B. Materials, Survaces, Interfaces and Biophysical*, Washington DC, US (Nov. 16, 2006), 110(45):22652-22663.
Alivisatos, Perspectives on the Physical Chemistry of Semiconductor Nanocrystals, J. Phys. Chem., (Aug. 1, 1996), 100(31):13226-13239.
Eychmuller, Structure and Photophysics of Semiconductor Nanocrystals, J. Phys. Chem. B, (Jun. 21, 2000), 32:104(28):6514-6528.
Harrison et al., Investigation of Factors Affecting the Photoluminescence of Colloidally-Prepared HgTe Nanocrystals, J. Mater. Chem., (1999), 9:2721-2722.

(56) References Cited

OTHER PUBLICATIONS

Hines et al., Synthesis and Characterization of Strongly Luminescing ZnS-Capped CdSe Nanocrystals, J. Phys. Chem., (1996), 100(2):468-471 (Abstract).
International Search Report and Written Opinion dated Aug. 5, 2015 for PCT/US2015/033288.
Kanemitsu et al., Excitions in silicon quantum structures, Journal of Luminescence, (1999), 83-84:283-290.
Korgel et al., Controlled Synthesis of Mixed Core and Layered (Zn,Cd)S and (Hg,Cd)S Nanocrystals Within Phosphatidylcholine Vesicles, Langmuir, (Mar. 11, 2000), 16(8):3588-3594.
Lambert et al., Embedding Quantum Dot Monolayers in Al2O3 Using Atomic Layer Deposition, Chemistry of Materials, vol. 23, 2011, 126-128.
Micic et al., Size Dependent Spectroscopy of InP Quantum Dots, J. Phys. Chem. B, (Jun. 19, 1997), 101 (25):4904-4912.
Murray et al., Synthesis and Characterization of Nearly Monodisperse CdE (E=S, Se, Te) Semiconductor Nanocrystallites, J. Am. Chem. Soc. (1993), 115(19):8706-8715.
Nirmal et al., Luminescence Photphysics in Semiconductor Nanocrystals, Acc. Chem. Res., (Nov. 25, 1999), 32(5):407-414.
Panigrahi et al., ZnO—SiO2 core-shell nanorod composite: Microstructure, emission and photoconductivity properties, Chemical Physics Letters 511, (2011), 91-96.
Pourret et al., Atomic Layer Deposition of ZnO in Quantum Dot Thin Films, Advanced Materials, vol. 21, 2009, 232-235.
Talapin et al., a Novel Organometallic Synthesis of Hihgly Luminescent CdTe Nanocrystals, J. Phys. Chem. B, (Mar. 22, 2001), 105(12):2260-2263.
Van Hemmen et al., Plasma and Thermal ALD of Al2O3 in a Commercial 200 mm ALD Reactor, Journal of the Electrochemical Society, (2007), 154(7):G165-G169.
Veprek, Electronic and mechanical properties of nanocrystalline composites when approaching molecular size, Thin Solid Films, (1997), 145-153.
Xu et al., Quantum Dots Confined in Nanoporus Alunina Membranes, Applied Physics Letters, (2006), 89:133110-1 to133110-3.
PCT/US2012/043349 International Search Report dated Oct. 29, 2012.
Supplementary European Search Report for EP 12801910 dated Nov. 12, 2014.

\* cited by examiner

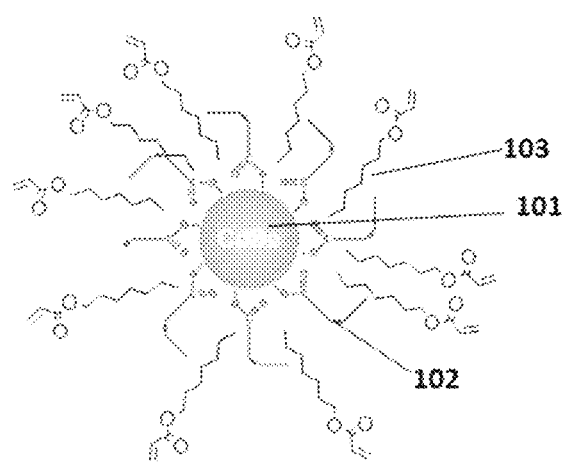

DISPERSION SYSTEM FOR QUANTUM DOTS HAVING ORGANIC COATINGS COMPRISING FREE POLAR AND NON-POLAR GROUPS

CROSS-REFERENCE TO RELATED APPLICATIONS

This application claims the benefit of and priority to U.S. Provisional Application No. 62/004,712 filed on May 29, 2014, entitled "Dispersion System for Quantum Dots", the contents of which is hereby incorporated by reference in its entirety.

BACKGROUND

While researches in biological fields are looking to quantum dots to replace organic fluorescent dyes, quantum dots also hold promise for use in electronic devices. Research is ongoing into incorporating quantum dots into photovoltaics, solid-state lighting (mainly as quantum dot phosphors), LCD display backlights, LCD display direct emitters (to replace the color filter), electroluminescent displays, and quantum computing devices. Semiconductor light emitting diode (LED) devices have been made since the early 1960s and currently are manufactured for usage in a wide range of consumer and commercial applications. The layers including the LEDs are based on crystalline semiconductor materials that require ultra-high vacuum techniques for their growth, such as, metal organic chemical vapor deposition. In addition, the layers typically need to be grown on nearly lattice-matched substrates in order to form defect-free layers. These crystalline-based inorganic LEDs have the advantages of high brightness (due to layers with high conductivities), long lifetimes, good environmental stability, and good external quantum efficiencies. The usage of crystalline semiconductor layers that results in all of these advantages, also leads to a number of disadvantages including high manufacturing costs, difficulty in combining multi-color output from the same chip, and the need for high cost and rigid substrates.

Since the mid-1980s, LCD displays have been brought out into the marketplace and there has been great improvements in device lifetime, efficiency, and brightness. Device lifetimes are routinely reported at many tens of thousands of hours. In comparison to crystalline-based inorganic LEDs, OLEDs have much reduced brightness (mainly due to small carrier mobilities), shorter lifetimes, and require expensive encapsulation for device operation. On the other hand, OLEDs enjoy the benefits of potentially lower manufacturing cost, the ability to emit multi-colors from the same device, and the promise of flexible displays if the encapsulation issues can be resolved.

To improve the performance of OLEDs, quantum dots were introduced in to the emitter layers to enhance the color gamut of the device and reduce manufacturing costs. Because of problems, such as, aggregation of the quantum dots in the emitter layer, the efficiency of these devices was rather low in comparison with typical OLED devices. The efficiency was even poorer when a neat film of quantum dots was used as the emitter layer. Regardless of any future improvements in efficiency, these hybrid devices still suffer from all of the drawbacks associated with pure OLED devices.

Recently, all-inorganic LEDs have been constructed by, for example, sandwiching a monolayer thick core/shell CdSe/ZnS quantum dot layer between vacuum deposited n- and p-GaN layers. However, such devices exhibit poor external quantum efficiency of 0.001 to 0.01% because of organic ligands of trioctylphosphine oxide (TOPO) and trioctylphosphine (TOP) insulators that result in poor electron and hole injection into the quantum dots. In addition, the structure is costly to manufacture, due to electron and hole semiconducting layers grown by high vacuum techniques, and sapphire substrates. Accordingly, it would be highly beneficial to construct an all inorganic LED based on quantum dot emitters which was formed by low cost deposition techniques and whose individual layers showed good conductivity performance. The resulting LED would combine many of the desired attributes of crystalline LEDs with organic LEDs.

Recently, QDs have proven useful as replacements to rare-earth phosphors in solid state lighting where they are energized by blue LEDs and provide the longer wavelengths to produce white light. They have also proven useful as components of an LCD display backlight where they provide the green and red wavelengths when energized by blue LEDs, the combined light being red, green, and blue. Ongoing research is aimed at printing QD pixels to replace the color filter layer in an LCD display.

SUMMARY

Disclosed herein are methods and compositions of nanoparticles having one or more layers of organic coating. In some embodiments, a nanoparticle comprises a core/shell nanocrystal comprising a first coating layer comprising a plurality of organic molecules, and a second organic coating layer surrounding the first organic coating layer, wherein the second coating layer comprises a plurality of organic molecules. Further, the organic molecules of the second coating layer are intercalated between the organic molecules of the first coating layer.

DESCRIPTION OF THE DRAWINGS

FIG. 1 illustrates a CdSe nanocrystal having a first coating layer of oleic acid and a second coating layer of heptyl acrylate intercalated in the oleic acid layer according to an embodiment.

DETAILED DESCRIPTION

Embodiments disclosed herein may be understood more readily by reference to the following detailed description and Examples. It is to be understood that the terminology used is for the purpose of describing specific embodiments only and is not intended to be limiting.

Unless defined otherwise, all technical and scientific terms have the same meaning as is commonly understood by one of ordinary skill in the art to which the embodiments disclosed belongs.

As used herein, "a" or "an" means "at least one" or "one or more."

As used herein, "about" means that the numerical value is approximate and small variations would not significantly affect the practice of the disclosed embodiments. Where a numerical limitation is used, unless indicated otherwise by the context, "about" means the numerical value can vary by ±10% and remain within the scope of the disclosed embodiments.

"Monodisperse" as used herein refers to a population of particles (e.g., a colloidal system) wherein the particles have substantially identical size and shape. For the purpose of the present invention, a "monodisperse" population of particles means that at least about 60% of the particles, preferably about 75% to about 90% of the particles, fall within a specified particle size range.

"Optional" or "optionally" may be taken to mean that the subsequently described structure, event or circumstance may or may not occur, and that the description includes instances where the event occurs and instances where it does not.

"Surface layer" as used herein refers to a layer of small-molecule ligands coordinated to the nanocrystal's outer surface, which may be further cross-linked or modified. The surface layer may have other or additional surface coatings that modify the solubility properties of the particle, which are sometimes referred to herein as "coating layers," "capping layers," or "coatings."

"Semiconductor" as used herein means any material that exhibits a finite band gap energy in the range of about 0.01 eV to about 10 eV.

"Nanocrystal" as used herein can refer to a particle made of an inorganic substance that typically has an ordered crystalline structure having at least one major dimension in the nanosize range, for example, at least one major dimension measuring from 1 to 1000 nanometers. The term "nanocrystal" can refer to a "core" nanocrystal consisting of crystalline particle without a shell, or a "core/shell" nanocrystal, which describes a nanocrystal having a nanocrystal core of a first material and a shell layer of a second material surrounding the core. In general, a nanocrystal including both core and core/shell nanocrystal can have a diameter of from about 1 to about 1000 nm, about 1 nm to about 100 nm, or about 1 nm to 50 nm.

The nanocrystals, such as those used in the embodiments described herein, can be bright fluorescent nanocrystals and quantum dots prepared from such bright fluorescent nanocrystals can also be bright. For example, a typical quantum yield for a nanocrystal can be at least about 10%, at least 20%, at least 30%, at least 40%, and at least 50% or greater than 50%. In some embodiments, nanocrystals can have a surface layer of ligands to protect them from degradation during use or while in storage; thus isolated nanocrystals made by the methods of embodiments can have a surface layer of ligands on the outside of the shell of the nanocrystal.

"Nanoparticle" or "quantum dot" as used herein refers to any nanocrystal, such as a core nanocrystal or core/shell nanocrystal, having any associated organic coating or other material on the surface of the nanocrystal that is not removed from the surface by ordinary solvation. The organic coating or other material can further be cross-linked, can have other or additional surface coatings that can modify the properties of the particle, for example, increasing or decreasing solubility in water or other solvents. Nanocrystals having such crosslinked or modified coatings on their surfaces are encompassed by the term "nanoparticle." Further, nanoparticles or quantum dots may have a tunable photophysical property in the near ultraviolet (UV) to far infrared (IR) range, and in particular, the visible range.

"Wavelength" as used herein refers to the emission band or peak wavelength emitted, absorbed, reflected, and so forth.

Various embodiments of the invention are directed to nanoparticles coated with two or more organic material layers, and compositions and devices such as light emitting diodes (LEDs) and light modules displays including such nanoparticles alone or in a polymer matrix. The LEDs and light modules of such embodiments can be incorporated into various optoelectrical devices including, for example, displays including, for example, backlight displays, multi-color displays, full color displays, monochrome displays, pixilated displays, and so on, and the solid state light sources. Other embodiments are directed to methods for preparing nanoparticles coated with two or more organic material layers.

The nanoparticles of various embodiments may include a nanocrystal having a first coating layer and at least a second coating layer intercalated with the first coating layer. The coating layers may prevent aggregation of the nanoparticles and improve the useful lifetime of the underlying nanocrystal.

In some embodiments, the nanocrystals and quantum dots described herein may have a first coating layer to form a nanoparticle. The first coating layer may include coordinating organic molecules having a polar head and a non-polar tail. The organic compounds typically include a Lewis base having a lone pair of electrons that are capable of donor-type coordination to metal atoms on the surface of the nanoparticle and can include, coordinating solvents like, mono- or multi-dentate ligands such as phosphines (trioctylphosphine, triphenolphosphine, t-butylphosphine), phosphine oxides (trioctylphosphine oxide), alkyl-amine (hexadecylamine, octylamine), aryl-amines, pyridines, and thiophenes. The non-polar tail can be saturated or unsaturated alkyl chains having from about 3 to about 24 carbons. Examples of such compounds include, but are not limited to, octadecene, TOPO, TOP, decylamine, octadecane, dioctylamine, tributylphosphine, oleylamine, fatty acids, and mixtures thereof.

In some embodiments, the first coating layer may be composed of or include one or more lipophilic carboxylic acid ligands. The lipophilic carboxylic acid can be a fatty acid. The fatty acid can have any size, however, fatty acid ligands containing about $C_3$-$C_{24}$ carbon atoms have been found to be particular useful in the practice of the invention although ligands having other chain lengths can be used. For example, the chain may comprise a saturated hydrocarbon, a monounsaturated hydrocarbon, or a polyunsaturated hydrocarbon. The hydrocarbon chain can further include a heavily branched or lightly branched hydrocarbon chain. One representative fatty acid ligand is oleic acid. Nanocrystals coated with other types of fatty acid ligands are also feasible and include, for example, butyric acid, caproic acid, caprylic acid, capric acid, lauric acid, myristic acid, palmitic acid, margaric acid, stearic acid, arachidic acid, behenic acid, lignoceric acid, myristoleic acid, palmitoleic acid, gadoleic acid, erucic acid, nervonic acid, linoleic acid, linolenic acid, parinaric acid, aracidonic acid, timnodonic acid, brassic acid, and clupanodonic acid.

In some embodiments, the nanocrystals and quantum dots described herein may have at least a second coating layer to form a nanoparticle with two organic coating layers. This second coating layer may compose organic molecules having a polar head and a non-polar tail, and may intercalate with the organic molecules of the first coating layer. The non-polar tail of the organic molecule present in the second coating layer may intercalate between the non-polar tails of the organic molecules of the first coating layer. Such an arrangement may prevent the nanoparticles from aggregation when present at high concentrations. For example, the coated nanoparticles of various embodiments may be kept at concentrations up to about 100 mg/mL or about 150 mg/mL, without forming aggregates and losing function. For example, in some embodiments, monodispersed coated nanoparticle may be kept at concentrations of from 10 mg/mL to 125 mg/mL, about 20 mg/mL to about 100 mg/mL, about 30 mg/mL to about 95 mg/mL, about 40 mg/mL to about 90 mg/mL, or any range or individual value encompassed by these ranges.

In some embodiments, the non-polar tails of organic molecules of the second coating layer are intercalated between the non-polar tails of the organic molecules of the first coating layer. An exemplary embodiment is show in FIG. 1 wherein the CdSe nanocrystal 101 is coated by a first coating layer of oleic acid and a second coating layer of heptyl acrylate. Further, the non-polar tails of heptyl acrylate 103 of the second coating layer are intercalated between the non-polar tails of the oleic acid 102 of the first coating layer.

As a result of intercalation, the ratio of the organic molecule of the second coating layer in contact with the organic molecule of the first coating layer may increase. This ratio may far exceed when compared to non-intercalating organic molecules that are in contact. In some embodiments, the ratio of the organic molecule of the second coating layer to the organic molecule of the first coating layer may be about 1:1, about 1:2, about 1:3, about 1:4, about 1:5, about 1:6, about 1:7, about 1:8, about 1:9, about 1:10, about 1:20, about 1:30, about 1:40, about 1:50, about 1:60, about 1:70, about 1:80, about 1:90, or about 1:100. In other embodiments, the ratio of the organic molecule of the first coating layer to the organic molecule of the second coating layer may be about 1:1, about 1:2, about 1:3, about 1:4, about 1:5, about 1:6, about 1:7, about 1:8, about 1:9, about 1:10, about 1:20, about 1:30, about 1:40, about 1:50, about 1:60, about 1:70, about 1:80, about 1:90, or about 1:100.

In some embodiments, about 40% of the organic molecules in the second coating layer may be intercalated in the first coating layer. In some embodiments, about 50% of the organic molecules in the second coating layer may be intercalated in the first coating layer. In some embodiments, about 60% of the organic molecules in the second coating layer may be intercalated in the first coating layer. In some embodiments, about 70% of the organic molecules in the second coating layer may be intercalated in the first coating layer. In some embodiments, about 80% of the organic molecules in the second coating layer may be intercalated in the first coating layer. In some embodiments, about 90% of the organic molecules in the second coating layer may be intercalated in the first coating layer. In some embodiments, about 95% of the organic molecules in the second coating layer may be intercalated in the first coating layer. In some embodiments, about 100% of the organic molecules in the second coating layer may be intercalated in the first coating layer.

Non-limiting examples of the organic molecules present in the second coating layer include phosphines (trioctylphosphine, triphenolphosphine, t-butylphosphine), phosphine oxides (trioctylphosphine oxide), alkyl-amine (hexadecylamine, octylamine), aryl-amines, pyridines, and thiophenes. The non-polar tail can be saturated or unsaturated alkyl chains having from about 3 to about 24 carbons. Examples of such compounds include, but are not limited to, TOPO, TOP, decylamine, octadecane, dioctylamine, tributylphosphine, oleylamine, fatty acids, and mixtures thereof. In some embodiments, the organic molecule can be a lipophilic carboxylic acid, such as a fatty acid. The fatty acid can have any size, however, fatty acid ligands containing about $C_3$-$C_{24}$ carbon atoms have been found to be particular useful in the practice of the invention although ligands having other chain lengths can be used. For example, the chain may comprise a saturated hydrocarbon, a monounsaturated hydrocarbon, or a polyunsaturated hydrocarbon. The hydrocarbon chain can further include a heavily branched or lightly branched hydrocarbon chain. One representative fatty acid ligand is oleic acid. Nanocrystals coated with other types of fatty acid ligands are also feasible and include, for example, butyric acid, caproic acid, caprylic acid, capric acid, lauric acid, myristic acid, palmitic acid, margaric acid, stearic acid, arachidic acid, behenic acid, lignoceric acid, myristoleic acid, palmitoleic acid, gadoleic acid, erucic acid, nervonic acid, linoleic acid, linolenic acid, parinaric acid, aracidonic acid, timnodonic acid, brassic acid, and clupanodonic acid.

In some embodiments, the polar head of the organic molecule in the second coating layer may be acrylate, methacrylate, cyanoacrylate, anhydride, alkyl, epoxy, isocyanate, acetate, phenolic group, carboxyl, thioester, amide, sulfhydryl, hydroxyl, and the like. For example, the organic molecule in the second coating layer may be heptyl acetate, octyl methacrylate, heptyl acrylate, heptyl isocyanate, dodecyl isocyanate, dodecyl acrylate, and the like. The reactive polar head, such as acrylates and epoxys can cross-link with other suitable polymers such as polyether sulfones, polyurethanes, polyesters, polyacrylates, polyamides, polyethers, polyolefins and copolymers thereof.

Further embodiments are directed to methods for making the coated nanoparticles described above. Such embodiments may include the steps of coating a nanoparticle with a first coating layer including of one or more of the materials described above to provide a nanoparticle having a first coating layer, and immersing the nanoparticles having a first coating layer in a solution containing a second coating material including of one or more of the materials described above. During the step of immersing the second coating material intercalates into the first coating material to produce a nanoparticle having a first coating layer and a second coating layers, i.e., coated nanoparticle.

In some embodiments, the first coating layer may be attached to the nanoparticle as a result of manufacture of the nanoparticle. For example, as described below in some manufacturing processes, nanoparticles are passivated using organic materials similar to those described above with regard to the first coating layer. In such cases, manufacturing process may serve as the step of coating the nanoparticle with a first coating layer, and these nanoparticles may be immersed directly in the second coating material. In other embodiments, coating the nanoparticle with a first coating layer may include the step of exchanging an organic material used to passivate the nanoparticle during manufacture with a first coating layer material.

In various embodiments, the solution of second coating material may include a high concentration of second coating material. For example, the solution of second coating material may be 100% coating molecule in pure liquid form. in other embodiments, the second coating material may be dissolved in a solvent and may be present at concentrations ranging, for example, from about 10 v/v % to about 99 v/v %, about 20 v/v % to about 98 v/v %, about 50 v/v % to about 98 v/v %, about 75 v/v % to about 95 v/v %, about 80 v/v % to about 90 v/v %, and the like, or any range or individual concentration encompassed by these ranges. The solvent used may vary among embodiments and may be, for example, toluene, acetonitrile, hexane, cyclohexane, n-propylacetate, tetrahydrofuran, ethyl acetate, anisole, and cymene. In some embodiments, the second coating solution may be free of additional components, and in other embodiments, additional components such as, for example, surfactants may be included in the solution of second coating material is small amounts. Intercalation can occur at ambient temperatures (about 20° C. to about 25° C.). In other embodiments, immersing may further include the step of heating the nanoparticles having a first coating layer immersed in the solution of a second coating material to a temperature of about 100° C. to about 250° C. In some embodiments, immersing may further include the step of stirring or mixing the nanoparticles having a first coating layer immersed in the solution of a second coating material.

The step of immersing the nanoparticle coated with a first coating layer can be carried out for any amount of time, and the time required may vary depending on the second coating layer material and the concentration of the second coating material in the solution. For example, in some embodiments, the immersing step may be carried out for about 4 hours to about 12 hours and, in some embodiments, can be carried out for up to 72 hours. Such times may further depend on whether the heating and/or stirring/mixing steps are carried out during immersing.

After immersing, the methods of various embodiments may include the steps of removing the coated nanoparticles from the solution, and in some embodiments, washing the coated nanoparticles with a dilute solvent or water to removed excess solvent or second coating material. In certain embodiments, such methods may include the step of drying the coated nanoparticles.

Some embodiments are directed to polymer compositions including the coated nanoparticles described above incorporated into a polymer matrix. For example, in some embodiments, the coated nanoparticles described above can be mixed with other polymers and cured to produce such a polymer composition. In such embodiments, the coated nanoparticles may be encapsulated by the polymer matrix such that the cured polymer completely surrounds or substantially surrounds the coated nanoparticle on all sides. In such embodiments, the second coating layer may not interact with the polymer matrix, or the second coating layer may form electronic or ionic bonds with the polymer matrix. In other embodiments, the coated nanoparticles may be incorporated into the polymer matrix, and the polar heads of the second coating layer may crosslink or otherwise react with or covalently bond to the polymer matrix.

The concentration of coated nanoparticles in the polymer matrix may be any concentration necessary to achieve the brightness and color contrast necessary for the application in which the polymer composition will be used. For example, in some embodiments, the polymer matrix may include about 0.1 mg to about 1 mg of coated nanoparticles per cubicentimeter. Regardless of whether the coated nanoparticles are encapsulated by the polymer matrix or incorporated into the polymer matrix, the nanoparticles may exhibit improved useful life and stability over other polymer matrix embedded nanoparticles.

Such embodiments are not limited to particular polymer matrices, and nearly any polymer can be used as the matrix material. For example, in some embodiments, vinyl and acrylate polymers such as polymers of alkylacrylate, alkyl methacrylate, allyl methacrylate, acrylic acid, methacrylic acid, acrylamide, 2-hydroxyethyl methacrylate, 2-hydroxypropyl methacrylate, thioethyl methacrylate, vinyl methacrylate, vinyl benzene, 2-hydroxyethyl acrylate, butyl acrylate, 2-ethylhexyl acrylate, vinyltrimethoxysilane, vinyltriethoxysilane, vinyl formate, vinyl acetate, vinyl propionate, vinyl butyrate, vinyl hexanoate, vinyltoluene, methyl styrene, chlorostyrene, styrenesulfonic acid, and any combination thereof can be used as the polymer matrix. In addition, bi-functional acrylic oligomers in combination with bi, tri and multifunctional crosslinkers may be used. Non-limiting examples include cyclohexane dimethanol demethacrylate, alkoxylate hexanediol diacrylate, alkoxylated neopentyl glycol diacrylate, polyethylene glycol dimethacrylate, tripropylene glycol diacrylate, ethoxylated bisphenol A diacrylate, and the like.

Further embodiments are directed to methods for making the polymer compositions described above. Such embodiments may typically include the step of combining one or more coated nanoparticles and a polymer matrix and curing the polymer matrix to make the polymer composition. In some embodiments, the coated nanoparticles may be provided in a solution. In other embodiments, the coated nanoparticles may be dried, and in certain embodiments, the coated nanoparticles may be rehydrated after being dried. Curing can be carried out by any method. For example, in some embodiments, combining may be carried out by melting the polymer matrix material and introducing the coated nanoparticles into the melted polymer matrix material. Such methods can be carried out in, for example, an extruder or melt mixing apparatus. In other embodiments, liquid components of a polymer matrix material can be combined with the coated nanoparticles and the mixture can be cured, for example, by chemical curing or under UV light. In still other embodiments, the polymer matrix may be used to make an ink that is printed onto a surface and cured under heat, by contacting air, or under UV light.

Nanoparticles of the coated nanoparticles, polymer compositions including coated nanoparticles, and methods for making coated nanoparticles and polymer compositions including coated nanoparticles described above can be any nanoparticles, nanocrystals, or quantum dots known in the art and these nanoparticles can be made of any suitable metal and non-metal atoms that are known to form semiconductor nanocrystals. For example, the semiconductor nanocrystals of various embodiments can be prepared from materials including, but are not limited to, Group 2-16, 12-16, 13-15 and 14 elements, and combining appropriate precursors can result semiconductor nanocrystals such as, but not limited to, ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, GaN, GaP, GaAs, GaSb, InP, InAs, InSb, AlAs, AlP, AlSb, PbS, PbSe, Ge and Si and binary, ternary and quaternary mixtures thereof, and the like.

In particular embodiments, the nanocrystals or quantum dots may be alloyed 2-6-6 SCNs having, for example, the formula $WY_xZ_{(1-x)}$, where W is a Group II element, Y and Z are different Group VI elements, and $0<X<1$. The term "2-6-6 SCN" represents a 3-element alloyed semiconductor with a Group II element-Group VI element-Group VI element composition. In some embodiments, the nanocrystals and quantum dots described herein may include Cd, Se, and S. Alloyed semiconductor nanocrystals are known in the art, for example, as described in U.S. Publication No. 2006/0028882, both of which are hereby incorporated by reference in its entirety. The term "alloyed" refers to two or more semiconductor materials forming a completely amalgamated solid wherein the two or more semiconductor materials are randomly distributed throughout the solid. In this respect, the term "alloy" refers to any solid, which is a product of an amalgamation process.

In particular embodiments, the semiconductor materials of alloyed nanocrystals and quantum dots may have a gradient of one or more of the semiconductor materials radiating from the center of the nanocrystal or quantum dot to the outermost surface of the nanocrystal. Such nanocrystals or quantum dots are referred to herein as "concentration-gradient quantum dots." For example, in some embodiments, a concentration-gradient quantum dot having at least a first semiconductor and a second semiconductor may be prepared such that the concentration of the first semiconductor gradually increases from the center of the concentration-gradient quantum dot to the surface of the quantum dot. In such embodiments, the concentration of the second semiconductor can gradually decrease from the core of the concentration-gradient quantum dot to the surface of the quantum dot. Without wishing to be bound by theory, concentration-gradient quantum dot may have a band gap energy that is non-linearly related to the molar ratio of the at least two semiconductors.

Concentration-gradient quantum dots may be prepared from any semiconductor material known in the art including those semiconductor materials listed above, and concentration-gradient quantum dots may be composed of two or more semiconductor materials. In particular embodiments, concentration-gradient quantum dots may be alloys of CdSeTe having a molecular formula $CdS_{1-x}Te_x$, CdSSe having a molecular formula $CdS_{1-x}Se_x$, CdSTe having a molecular formula $CdS_{1-x}Te_x$, ZnSeTe having a molecular formula $ZnSe_{1-x}Te_x$, ZnCdTe having a molecular formula $Zn_{1-x}Cd_xTe$, CdHgS having a molecular formula $Cd_{1-x}Hg_xS$, HgCdTe having a molecular formula HgCdTe, InGaAs having a molecular formula GaAlAs, GaAlAs having a molecular formula GaAlAs, or InGaN having a molecular formula InGaN, where x in each example can be any fraction between 0 and 1.

In some embodiments, a core nanocrystal can be modified to enhance the efficiency and stability of its fluorescence emissions by coating a nanocrystal core with a semiconductor material to create a shell around the nanocrystal core thereby creating a core/shell nanocrystal, and in some embodiments, the nanocrystals may include more than one shell. The core/shell nanocrystals of such embodiments can have two or more distinct layers: a semiconductor or metallic core and one or more shells of an insulating or semiconductor material surrounding the core.

By "semiconductor shell" is meant a thin layer of semiconductor material (typically 1-10 atomic layers thick) deposited on the outer surface of a core nanocrystal. This "semiconductor shell" can be composed of the same material as the core or a different the semiconductor material than the core, and in some embodiments, at least one semiconductor material in the shell may be different than the semiconductor materials making up the core. The semiconductor shell should have a wider band gap than the core in order to efficiently protect the core electronically and sterically. The semiconductor shell can include any semiconductor material including, but not limited to, Cd, Zn, Ga, Pb, Mg, S, Se, Te, P, As, N, O, Sb, and combinations thereof, and in certain embodiments, the semiconductor shell may include ZnS, CdS, CdSe, CdTe, GaAs, or AlGaAs. The one or more shell layers may be prepared from a uniform dispersion of semiconductor materials or alloyed semiconductor materials having concentration gradients similar to those described for core nanocrystals.

The shell can vary in thickness but typically has a thickness of at least 0.5 nm. For example, the shell thickness can be about 0.1 nm or more; or about 1 nm or more; or about 25 nm or more. In certain embodiments, the shell thickness is about 3 nm or less or about 2 nm or less. Certain nanocrystals include a shell having about 3 monolayers of ZnS (e.g., about 1 nm). Thicker ZnS shells constructed of more than several monolayers (e.g., 5-10; or 10-15; or 15-20; or 20-30 monolayers) also can be produced by the methods described herein.

Without wishing to be bound by theory, the addition of a shell may reduce the effect of surface defects on the semiconductor nanocrystal core which can result in traps, or holes, for electrons or other non-radiative energy loss mechanisms that degrade the electrical and optical properties of the core, and either dissipate the energy of an absorbed photon or at least affect the wavelength of the fluorescence emission slightly, resulting in broadening of the emission band. An insulating layer at the surface of the semiconductor nanocrystal core can provide an atomically abrupt jump in the chemical potential at the interface that eliminates energy states that can serve as traps for the electrons and holes resulting in a higher efficiency luminescence. It should be understood that the actual fluorescence wavelength for a particular semiconductor nanocrystal core may depend upon the size of the core as well as its composition. Thus, the emission wavelengths described above are merely approximations, and nanocrystal cores of the various compositions described above may actually emit at longer or shorter wavelengths depending upon their size.

The nanocrystals, quantum dots, and concentration-gradient nanocrystals useful in various embodiments can be of any size. For example, nanocrystals useful in embodiments may have a mean particle diameter (MPD) of form about 1 nm to about 100 nm, from about 1 to about 50 nm, and from about 1 to about 25 nm. More specific nanocrystals and quantum dots useful in embodiments can include, but are not limited to, those nanocrystals having an MPD of from about 0.5 nm to about 5 nm, about 1 nm to about 50 nm, about 2 nm to about 50 nm, about 1 nm to about 20 nm, about 2 nm to about 20 nm, or from about 2 to about 10 nm. For example, in particular embodiments, nanocrystals may have an MPD of, about 0.5 nm, about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 25 nm, about 30 nm, about 35 nm, about 40 nm, about 45 nm, about 50 nm, and the like and an MPD between any two values listed above. For a nanocrystal that is not substantially spherical, e.g., rod-shaped, the diameter at its smallest dimension may be from about 1 to about 100 nm, or from about 1 nm to about 50 nm or 1 nm to about 25 nm.

A typical single-color preparation of nanocrystals or quantum dots includes crystals that are preferably of substantially identical size and shape, and in some embodiments, the nanocrystals or quantum dots of embodiments can be roughly spherical. In other embodiments, the nanocrystals can be of any of numerous non-spherical shapes. For example, nanocrystals can be synthesized in a variety of shapes including, but not limited to, spheres, rods, discs, pyramid or pyramid like, nanorings, nanoshells, tetrapods, nanowires, and so on. Without wishing to be bound by theory, nanocrystals of different morphologies can have distinctive properties such as spatial distribution of the surface charge, orientation dependence of polarization of the incident light wave, and spatial extent of the electric field, and these distinctive properties may provide nanocrystals that are useful for particular purposes. In certain embodiments, the non-spherical nanocrystals may be useful based on their emission color.

It is well known that the color (emitted light) of the semiconductor nanocrystal can be "tuned" by varying the size and composition of the nanocrystal. Nanocrystals can absorb a wide spectrum of wavelengths, and emit a narrow wavelength of light. The excitation and emission wavelengths are typically different, and non-overlapping. The nanocrystals of a monodisperse population may be characterized in that they produce a fluorescence emission having a relatively narrow wavelength band. Examples of emission widths (full-width at half-maximum of the emission band, FWHM) useful in embodiments include less than about 200 nm, less than about 175 nm, less than about 150 nm, less than about 125 nm, less than about 100 nm, less than about 75 nm, less than about 60 nm, less than about 50 nm, less than about 40 nm, less than about 30 nm, less than about 20 nm, and less than about 10 nm. In particular embodiments, the FWHM can from about 20 nm to about 50 nm or from about 30 nm to about 35 nm.

The relationship between size and fluorescence wavelength of nanocrystals is well known, and in general, the nanocrystals of embodiments can be sized to provide fluorescence in the UV, visible, or infrared portions of the electromagnetic spectrum because this range is convenient for use in monitoring biological and biochemical events in relevant media. For example, in some embodiments, a CdSe nanocrystal having a diameter of about 3 nm may emit at a wavelength of about 525 nm, and in other embodiments, a ZnTe nanocrystal having a diameter of about 6 nm to about 8 nm may emit at a wavelength of about 525 nm. In still other embodiments, InP or InAs nanocrystals having a smaller diameter may emit at the same wavelength. In such embodiments, a ZnTe nanocrystal having generally larger diameters may have a larger absorption cross-section and produce brighter fluorescence. In other embodiments, a smaller nanocrystal may be necessary to, for example, achieve an appropriate hydrodynamic radius and maximize renal clearance for in vivo use, and the CdSe, InP, or InAs nanocrystals may be preferred.

Preparations of concentration-gradient quantum dots of various embodiments may similarly have substantially identical size and shape. However, unlike conventional quantum dots that are not alloyed and do not have a concentration gradient of semiconductor materials, varying the concentration of semiconductor materials and/or the extent of the concentration gradient can result in different populations of quantum dots of substantially the same size that fluoresce at different wavelengths thereby providing populations of quantum dots having substantially the same MPD that fluoresce at different colors. Thus, certain embodiments of the invention conversion layers including concentration-gradient quantum dots having substantially the same diameter and exhibiting different colors when excited.

In various embodiments, a significant proportion of the nanocrystals used in a particular application may be the same substantially size. For example, in some embodiments, at least about 60%, at least about 70%, at least about 80%, at least about 90%, at least about 95%, or about 100% of the nanocrystals can be substantially the same size. One of ordinary skill in the art will realize that particular sizes of nanocrystals, such as of semiconductor nanocrystals, are generally obtained as particle size distributions. The variance in diameter or size dispersity of populations of nanocrystal can be described as the root mean square ("rms"), where the smallest major axis may generally be used as the diameter for non-spherical particles. The root mean square of the nanocrystal populations used in embodiments can be less than about 30% rms, less than about 20% rms, or less than about 10% rms and in certain embodiments, less than about 9% rms, less than about 8% rms, less than about 7% rms, less than about 6% rms, less than about 5% rms, or a percentage between any two values listed. Such a collection of particles may sometimes referred to as being "monodisperse."

The quantum yield for the nanocrystals of various embodiments can be greater than about 10%, greater than about 20%, greater than about 30%, greater than about 40%, greater than about 50%, greater than about 60%, greater than about 70%, greater than about 80%, greater than about 90%, and ranges between any two of these values, and in particular embodiments, the quantum yield can be greater than about 30%, greater than about 50% or greater than about 70%. In some embodiments, a core nanocrystal can be less than about 10 nm in diameter, or less than about 7 nm in diameter, or less than about 5 nm in diameter.

In some embodiments, the emitted light can have a symmetrical emission of wavelengths. The emission maxima can be at any wavelength from about 200 nm to about 2,000 nm. Examples of emission maxima useful in embodiments can include, but are not limited to, about 200 nm, about 400 nm, about 600 nm, about 800 nm, about 1,000 nm, about 1,200 nm, about 1,400 nm, about 1,600 nm, about 1,800 nm, about 2,000 nm, and ranges between any two of these values. The fluorescence of a monodisperse population of nanocrystals can be characterized by the wavelength of light emitted when irradiated, and the emission maximum for a particular species of can be selected by the skilled artisan to provide a nanocrystals of any color. In various embodiments, the spectral range of a monodisperse population of nanocrystals encompassed by embodiments can be from about 370 nm to about 1200 nm, about 370 nm to about 900 nm, or from about 470 nm to about 800 nm, and in certain embodiments, nanocrystals, about 460 nm, about 525 nm, about 565 nm, about 585 nm, about 605 nm, about 625 nm, about 655 nm, about 705 nm, or about 800 nm.

In some embodiments, the nanocrystals and quantum dots described herein may have an inorganic coating. Any inorganic materials may be used either alone or in combination to provide the inorganic coating of the nanocrystals and quantum dots of various embodiments. For example, in some embodiments, the inorganic coating may include silicon dioxide, silicon monoxide, silicon nitride, zirconium oxide, tantalum oxide, lanthanum oxide, cerium oxide, hafnium oxide, or a combination thereof, and in certain embodiments, the inorganic coating may include silicon dioxide. As discussed above, in embodiments, the inorganic coating may include substantially no organic components. However, in some embodiments, the inorganic coating may include less than about 30% organic components, less than 20%, less than 10%, less than 5%, or less than 1% organic components. The organic components may represent residual ligand used during synthesis of the nanocrystal or quantum dot. In some embodiments, organic components may be used to tailor the activity of the nanocrystal or quantum and may be intentionally included in the coating composition.

As discussed above, a passivation layer may formed on the outermost surface of the nanocrystal to provide a non-reactive layer on the surface of the nanocrystal to provide a tighter confinement of the quantum-mechanical wave functions so they do not extend beyond the surface of the passivation material. Thus, the quantum-mechanical bandgap of the passivation material should be of sufficient magnitude to prevent undesired interaction of the nanocrystal's desired wave functions with the ambient chemical environment. In addition, passivation may prevent chemical contamination of the nanocrystal further enhancing the stability of the passivation material.

In some embodiments, passivation may be enhanced by providing a secondary inorganic passivation material in addition to the inorganic coating material. Any passivation material known in the art may be used in this regard, and in certain embodiments, one or more secondary passivation materials may be present in one or more layers. Exemplary secondary passivation materials include, but are not limited to, aluminum, carbon, silicon, and combinations thereof. In certain embodiments, the secondary passivation material may be aluminum. Aluminum is a well-known oxygen scavenger and forms aluminum oxide ($Al_2O_3$), which provides a strong barrier to oxidation and other degradation processes. $Al_2O_3$ is also optically transparent and has a band gap for electrons and holes much greater than many of the semiconducting materials in the quantum dots themselves.

In some embodiments, nanocrystals or quantum dots having a concentration gradient 2-6-6 core, a first shell of a binary semiconductor material, a second shell of a binary semiconductor material, a tertiary semiconductor material, or combination thereof, and a passivation layer including inorganic materials may be incorporated into the conversion layer. For example, in some embodiments, the core may be a concentration-gradient CdSeS nanocrystal in which the gradient may be varied to produce nanocrystals the fluoresce in different colors, a first shell layer of CdS or ZnS, and a second shell layer of ZnS, ZnCdS, or a combination of ZnS and ZnCdS. The passivation layer may include aluminum oxide ($Al_2O_3$), an inorganic coating material such as fumed silica ($SiO_2$), or a combination of $Al_2O_3$ and $SiO_2$. In some embodiments, the first and second shell layers may be uniform, and in other embodiments, the first and second shell layers may be alloyed to produce concentration-gradient shell layers.

Also disclosed herein are methods of preparing the nanocrystals. The precursors used in the preparation of the nanocrystals and quantum dots of various embodiments may be prepared from any known precursors. In particular, suitable core and shell precursors useful for preparing semiconductor cores are known in the art and can include group 2 elements, group 12 elements, group 13 elements, group 14 elements, group 15 elements, group 16 elements, and salt forms thereof. For example, a first precursor may include metal salt ($M^+X^-$) including a metal atom ($M^+$) such as, for example, Zn, Cd, Hg, Mg, Ca, Sr, Ba, Ga, Al, Pb, Ge, Si, or in salts and a counter ion ($X^-$), or organometallic species such as, for example, dialkyl metal complexes. In such embodiments, first precursors can include zinc salts, such as zinc carboxylate salts, including zinc acetate, zinc oleate, and zinc stearate, and the like, as well as zinc chloride, and organometallic precursors, such as diethyl zinc, and mixtures thereof. In other embodiments, suitable a first precursor can include zinc phosphonates, zinc phosphinic acids, cadmium phosphonates, cadmium phosphinic acids, and mixtures thereof. In still other embodiments, a first precursor can include cadmium salts, such as cadmium carboxylate salts, including cadmium acetate, cadmium oleate, and cadmium stearate, and the like, as well as cadmium nitrate, cadmium oxide, and organometallic precursors, such as dimethyl cadmium, and mixtures thereof.

A second precursor may include a non-metal atom, which may be provided as an ionic or neutral non-metal species. In some embodiments, a second precursor may include one or more of elemental sulfur, elemental phosphorous, elemental selenium, or elemental tellurium precursors, or in other embodiments, a second precursor may include one or more complexes of, for example, sulfur, selenium, or tellurium with chalcogen sources such as TOP to produce TOPS, TOPSe or TOPTe, or bis(trimethylsilyl) to produce $TMS_2S$, $TMS_2Se$, $TMS_3P$, $TMS_3AS$, or $TMS_2Te$. In still other embodiments, second precursors can include, but are not limited to, oleylamine sulfide, oleylamine selenide, oleylamine telluride, decylamine sulfide, decylamine selenide, decylamine telluride, octadecene sulfide, octadecene selenide, octadecene telluride, and mixtures thereof. The selection of suitable precursors for the preparation of various core and core/shell nanocrystals is within the purview of those of ordinary skill in the art.

The solvent used in various embodiments may vary. For example, suitable solvents can include, but are not limited to, hydrocarbons, amines, phosphines, carboxylic acids, phosphine oxides, alkylphosphonic acids, and mixtures thereof, and in more specific embodiments, solvents include, octadecene, TOPO, TOP, decylamine, octadecane, dioctylamine, tributylphosphine, oleylamine, oleic acid, and mixtures thereof. In certain embodiments, the core or shell precursor may be in a solution with octadecene, TOPO, or TOP as the solvent.

In various embodiments, the reaction mixture may be heated to a temperature sufficient to form of a core of a nanocrystal, and the step of heating can be carried out for any period of time. For example, in some embodiments, the temperature can be from about 200° C. to about 350° C. However, higher or lower temperatures may be appropriate for a particular reaction involving specific precursors and/or multi-functional ligands. The time period may additionally vary based on the precursors and/or multi-functional surface ligands used and in some embodiments, may be from about 30 minutes to about 48 hours. In other embodiments, the time period for heating may be up to about 5 hours, up to about 6 hours, or up to about 12 hours, and in still other embodiments, the time period may be from about 15 minutes to about 4 hours, or from about 30 minutes to about 2 hours. Of course, the time periods of embodiments include any time between the time periods provided above; thus, the time period of various embodiments may be for example, about 45 minutes, or about 1, 1.25, 1.5, 1.75, 2, 2.25, 2.5, 2.75, 3, 3.25, 3.5, 3.75, or 4 hours and so on.

In certain embodiments, the solution or mixture prepared as above can further include, for example, a reaction promoter and additional solvents and/or ligands. For example, a reaction promoter can be added to adjust the oxidation state of one or both of the precursors if the oxidation states of the two precursors would need to be adjusted for reaction to occur. Thus, in some embodiments, nanocrystals prepared according to the methods of this disclosure may have portions of the surface covered by multi-functional ligands described above and other portions of the surface covered by other ligands such as trialkylphosphines, trialkylphosphine oxides, trialkylamines, alkyl carboxylates, and alkyl phosphonic acids.

Preferably, the core nanocrystals are cleaned before they are used in a subsequent step to apply a shell. Solvents used to rinse or clean the nanocrystals should be carefully purified and dried and oxygen-free. The cores can be precipitated from the reaction mixture and collected by filtration or centrifugation, and separated from the bulk of the mixture. Then they can be rinsed with a solvent that does not dissolve them, also. For example, the reaction mixture can be diluted with acetonitrile and n-butanol, or with methanol, or mixtures of such solvents that form a miscible organic phase that is inhospitable to the lipophilic nanocrystals produced from the above reaction, and causes them to precipitate. The precipitated nanocrystals are collected and then rinsed with one or more solvents such as butanol or methanol or toluene or mixtures thereof. The nanocrystals can then be dissolved in a nonpolar, non-coordinating solvent such as hexanes.

Formation of the shell may be carried out by any method. For example, in some embodiments, a core/shell nanocrystal may be prepared by providing one or more additional semiconductor precursors such as the first core precursor or second core precursors described above, which can be different than the precursors used to form the core, following core preparation, and in certain embodiments, additional solvents, multi-functional ligands, and/or reaction promoters may be provided. In some embodiments, the method may include the step of heating the mixture, and as a result of heating, the additional precursors may precipitate on the surface of the core and provide a shell layer, i.e., a semiconductor or insulator layer over the core. In other embodiments, the additional nanocrystal precursors, solvents, multi-functional ligands, and/or reaction promoters may be added to a heated mixture that contains preformed cores to initiate formation of the shell.

In some embodiments, the core/shell nanocrystals may be capped or coated by one or more layers of organic molecules described herein. The organic layers may be coated by any known methods in the art. In some cases, it may be desirable to exchange one organic coating for another organic coating. For example, the nanoparticles may be obtained commercially with a cap compound unsuitable for the intended use. In such cases, the nanoparticles may be subjected to a cap exchange reaction to remove the undesirable caps and to provide the nanoparticle with other, more desirable cap compounds.

A cap exchange reaction typically has two basic steps, which may or may not be performed separately from one another: (1) dissociating the existing cap compounds from the surface of the nanoparticles, and (2) associating the nanoparticles with one or more desired cap compounds. The step of dissociating may comprise precipitation, or "crashing out," of the existing cap compounds, e.g., by combining the nanoparticles with a solvent so as to disassociate the existing cap compound from the quantum dots. The solvent may be an organic solvent, such as a hydroxyalkyl compound, e.g., methanol. The solubility of the cap compounds in preferred solvents is sufficiently low to precipitate the dissociated cap compounds. The dissociation step may include isolating the now uncapped quantum dots from the dissociated cap compounds, e.g., by filtration, centrifugation, decanting, or the like, or a combination thereof.

In some embodiments, the nanoparticles with a single layer of organic molecule coating may again be coated with a second layer of same or a different organic molecule. This may be performed by mixing a concentrated solution of the nanoparticle with a single layer coating in a solvent that contains the second organic molecule. Mixing may be performed for about 30 minutes, or for about 1, 4, 6, 8, 12, 24 hours and so on.

Further embodiments are directed to methods for preparing the nanocrystals and quantum dots having an inorganic coating. Such embodiments, generally, include the steps of forming a nanocrystal or quantum dot having an organic coating and replacing the organic coating with an inorganic coating material. The step of replacing may include the individual steps of removing or stripping the organic coating material from the outer surface of the nanocrystal or quantum dot, providing an inorganic coating material capable of binding to the outer surface of the nanocrystal, and binding the inorganic coating material to the outer surface of the nanocrystal or quantum dot. In some embodiments, methods for preparing nanocrystals and quantum dots having an inorganic coating may include the step of purifying the coated nanocrystal. The step of purifying may be carried out by any method. For example, in some embodiments, the nanocrystals can be purified by submersing the nanocrystals in a solvent solution and removing the nanocrystals from the solution. Any solvent may be used to purify the nanocrystals, and in certain embodiments, the solvent solution may be a one or more organic solvents.

In certain embodiments, the solvent may act simultaneously as a solvent and a weak-binding ligand for quantum dots. For example, one solvent that meets these criteria is pyridine. Thus, embodiments, are directed to methods for preparing quantum dots using pyridine as the solvent. In addition to weakly-binding the quantum dots and providing a solvent for exchange of passivating ligance, pyridine forms an interpenetrating gel network with many inorganic compounds that may be used to form the inorganic coating such as, for example, fumed silica thereby stabilizing these coating materials.

In some embodiments, quantum dots may be prepared and isolated in the customary manner and, therefore, may include a coating of organic ligands. The organic ligands may be dissociated from the quantum dot and replaced with pyridine by, for example, combining the ligand coated nanoparticles with a sufficient amount of pyridine and heating this mixture. In other embodiments, pyridine may be the primary solvent in each step of the synthesis process. By such methods, quantum dots can be isolated in pure form in pyridine and/or suspended in pyridine to create a suspension of nanocrystals in pyridine.

After the quantum dots have been isolated and/or suspended in pure pyridine, the inorganic coating material may be added to the quantum dot/pyridine suspension at a weight ratio sufficient to coat the quantum dot with inorganic coating material. In particular embodiments, the inorganic coating may be fumed silica. Fumed silica consists of molecule-sized particles of amorphous silica ($SiO_2$) fused into branched, chainlike, three-dimensional secondary particles. These particles have a high density of oxygen atoms with available electrons for electrostatic binding to the surface of the quantum dots. The high density of oxygen atoms allows the fumed silica to dislodge the pyridine from the surface of the quantum dot allowing the fumed silica to bind directly to the outermost surface of the quantum dot.

Following exchange of the pyridine for fumed silica on the outermost surface of the nanocrystals. the pyridine can then be evaporated from the suspension leaving a dry powder consisting of quantum dots complexed with fumed silica. Thus, embodiments of the invention include a dry powder of quantum dots complexed with fumed silica. The quantum dot/fumed silica complex include less than about 30% organic components, less than 20%, less than 10%, less than 5%, or less than 1% organic components, and in particular embodiments, the quantum dot/fumed silica complex may include an inorganic coating having substantially no organic components. Moreover, the quantum dot/fumed silica complex is stable and exhibits persistent fluorescence outside of solution and in the absence of organic ligands and organic solvents.

The nanoparticles disclosed herein may be combined with various polymer matrixes to form composite materials. Such composite materials may find use in preparing optoelectronic devices, such as light emitting diodes, photovoltaic cells, lasers and photodetectors. Suitable compositions of the polymer and the nanoparticles can be prepared using any of a variety of techniques, examples of which include solution blending, melt blending, and powder blending. Preferably, the compositions may be prepared by mixing the polymer, which is dissolved in a suitable solvent, with nanoparticles. Preferably, the nanoparticles are at least partially soluble in the same or similar solvent the polymer is dissolved in.

Suitable films of the polymer and the nanoparticles can be prepared using any of a number of film forming techniques known in the art, for example, spin coating, doctor blade coating, web coating, gravure coating, microgravure coating, ink jet printing, and spray coating. After coating, the solvent is typically removed by evaporation. In some embodiments, the nanoparticles may be contacted with a thermoset prepolymer and cured, the thermoplastic polymer that is later extruded or injection molded.

The nanoparticles disclosed herein may also be used in waveguides. Core layer of the waveguides may include a polymeric composition including a polymer matrix and uniform distribution of nanoparticles in the polymer matrix. Such waveguides may be used in optical devices, such as splitters, wavelength multiplexers and demultiplexers, optical add/drop multiplexers, variable attenuators, switches, light sources, and more.

In some embodiments, the nanoparticles disclosed herein may be part of a light module. For example, a light module may include a first substrate; a conversion layer adjacent to the first substrate and contacting the first substrate, the conversion layer comprising at least one nanoparticle and a matrix material; and a second substrate adjacent to the conversion layer and contacting the conversion layer on a surface opposite the surface contacting the first substrate.

In other embodiments, the conversion layer may include a matrix material combined with the at least one nanoparticle or array of nanoparticles and to provide a material having the nanoparticles embedded in the binder or support material. The matrix material may be any material known in the art, and in particular embodiments, the matrix material may be optically transparent or sufficiently transparent to not interfere with the emission of the nanoparticles during use of the device. In some embodiments, the matrix material may be a polymeric material, and in particular embodiments, the polymeric material may be curable using ultraviolet light or heat. Non-limiting examples of such polymeric materials include epoxies, silicones, sol-gels, acrylic based, or any other cross linkable system where the linking conditions are not detrimental to the QDs.

The nanoparticles of various embodiments may be active in a single wavelength range, meaning light is absorbed at a first wavelength and emitted at a single second wavelength. In other embodiments, the nanoparticles or quantum dots may be an array of nanoparticles or quantum dots that absorb light of a first wavelength and emit light of various second wavelengths. For example, in some embodiments, the an array of nanoparticles or quantum dots may include a quantity of nanoparticles or quantum dots that adsorb light in the blue spectrum and emit light in the red spectrum, a quantity of nanoparticles or quantum dots that adsorb light in the blue spectrum and emit light in the green spectrum, and a quantity of nanoparticles or quantum dots that adsorb light in the blue spectrum and emit light in the blue spectrum. Such an array of nanoparticles or quantum dots may be provided in a random distribution in which the nanoparticles of various activities are combined and distributed within the conversion layer as an unpatterned array, or in certain embodiments, the array of nanocrystals or quantum dots may be patterned. In embodiments in which the array is patterned, any pattern known in the art may be used. For example, in some embodiments, a stripe of nanoparticles having the a first activity (i.e., emitting at the same wavelength) may be positioned on a substrate next to a stripe or nanoparticles having a second activity, and so on to provide a striped pattern. In other embodiments, nanoparticles having different activities may be provided in different geometrically shaped zones such as, for example, squares, rectangles, circles, ovals, waves, lines, and so forth, that can be adjacent to one another or interconnected such that portions of a zone of nanoparticles having a first activity can overlap portions of zones having a second and/or third activity. In embodiments in which the quantum dots are arranged in a pattern, the composite output spectrum of the conversion layer may be determined primarily by the dimensions of the various substructures and the concentrations of the QDs in those structures.

In some embodiments, light modules may further include one or more substrate layers. Generally, the substrate layer may be composed of any clear or translucent material including, for example, glass, or a clear polymer, and the substrate layer may be flexible, semi-rigid, rigid, or a combination thereof. In some embodiments, a conversion layer may be disposed on a single substrate layer, or the conversion layer may be disposed between a substrate layer and a second none substrate layer such as, for example, a light source.

In still further embodiments, a substrate layer may be disposed between two or more conversion layers, and in particular embodiments, multiple alternating substrate and conversions layers may be combined into a single module. For example, a first conversion layer of red emitting nanocrystals may be adjacent to a second conversion layer of green emitting nanocrystals. Between the first conversion layer and the second conversion layer may be at least one substrate layer, and this substrate layer can be treated or include coatings or associated intermediate layers as discussed below. Additional substrate layers can be positioned on opposing ends of the module contacting the first and second conversion layers, respectively. When placed under a blue input light source where incoming light can pass through the conversion layers unmodified, such a module can be used to produce a red, green, blue spectrum of light commonly used in color displays. In still further embodiments, each of the conversion layers may be patterned, as discussed above, to further enhance the output of the module.

In some embodiments, the light module may further include a light source positioned and arranged to irradiate the conversion layer. The light source may be any light source known in the art including light emitting diodes (LED), incandescent bulbs, fluorescent bulbs, lasers, electrolumiscents, or combination thereof and may provide light of any wavelength or spectral source. For example, in various embodiments, the light source may provide white light, green light, yellow light, orange light, red light, blue light, violet light, ultraviolet light, or any combination thereof. The light source may be a single light source or may be the combination of more than one light source. In particular exemplary embodiments, light source may provide blue light, i.e., light having any wavelength shorter than 500 nm.

In some embodiments, the conversion layer, substrate layer, or combinations thereof may be textured, patterned, coated, chemically modified, or otherwise treated to facilitate binding of the conversion layer to the substrate, and in particular embodiments, the substrate layer may be treated as described above to interact with incoming or outgoing light. In various embodiments, the treated portion of the substrate may be opposite the conversion layer. In other embodiments, the treated portion of the substrate may be provided on surface of the substrate directly contacting the conversion layer, or the conversion layer itself may be treated by providing a texture, pattern, coating, or chemical modification. In such embodiments, a treatment may cause an alteration of the underlying substrate or conversion layer to a particular depth within the substrate or conversion layer. In other embodiments, the treatment may produce an additional layer that on or between the underlying substrate or conversion layer.

In some embodiments, the light module can further include the one or more devices for collimating light such as, for example, reflector cups, or a color filter. the collimating device or color filter may be positioned to contact light before the light enters the conversion layer and can be associated with either the conversion layer, substrate, light source, or any intermediate or treatment layer (not pictured). In particular embodiments, the light module may include a diffusing layer such as, for example, a photonic crystal film, positioned between the substrate layer and the light source that may allow the conversion layer to more efficiently increase the path length of the entering light widening the viewing angle of the output light by giving it a more Lambertian distribution. Such a diffusion layer may be planar or the diffusion layer may have a pattern. For example, in certain embodiments, a photonic crystal film diffusion layer may have a hexagonal waffle pattern that is used to suppress zero order transmission while allowing second and third order transmissions.

In some embodiments, diffusion may be further improved by adding a scattering agent to the conversion layer. The scattering agent may be any material that has low absorption at the wavelengths of interest and a refractive index that differs significantly from the surrounding matrix. A scattering agent may also allow back scattered light to be redirected and exit the conversion layer in the intended direction or be converted by the conversion layer. These scattering agents may be any material that has low absorption at the wavelengths of interest and differs significantly in refractive index from the surrounding matrix. Examples of scattering agents in matrix materials that are suitable for use in the conversion layers of embodiments include poly(methyl methacrylate) (PMMA) in silicone, alumina in silicone, silica in silicone, and the like and combinations of these.

Diffusion of the light entering the light module can be further modified in a number of ways to achieve various point spread functions (PSF), and in some embodiments, the PSF may be modified in a wavelength dependent, which without wishing to be bound by theory, may allow picture processing algorithm need to consider only one color or the white light combination of colors simplifying image processing software. The appearance of the display at a particular point or pixel is the superposition of all sources contributing to that pixel. As the light progresses through the conversion layer at an angle the blue input light is progressively converted to green and red by the quantum dots in the conversion layer. Because the path length through the film at an angle is greater than the perpendicular length by a factor of $1/\cos(u)$, where u is the angle of the ray to the normal, as blue light moves away from the light source the spectral composition of light coming from the conversion layer will be progressively depleted in blue while becoming progressively more yellow.

Additionally, changing the thickness of the film does not change the number of quantum dots that a ray of blue light passes if the total number of quantum dots is the same in each film. Changing the film thickness only changes the number of quantum dots per unit volume or concentration, and changing the film thickness will not have much effect on the appearance of the film, since the inverse cosine relationship of the path length ratios will still hold. However, quantum dots become highly scattering in the excited state possibly due to the formation of a large dipole moment. The thinner the film, the easier it is for a scattered blue photon to escape before being absorbed by a green or red quantum dot and the same is true of a scattered green photon escaping before being absorbed by a red quantum dot. However, quantum dots in an excited state create a PSF for the blue light that matches the quantum dot PSF. Thus, in some embodiments, a thin conversion layer may provide sufficient diffusing can be achieved without incorporating a diffusing agent into light module to enhance the scattering of the blue LED light.

In still further embodiments, the light module may include an reflective layer to redirect backscattered light in the preferred direction. For example, an antireflective coating may be provided on or within the module to improve the exiting of light from the module. In certain embodiments, an reflective may be provided between the conversion layer and substrate layer, and in embodiments, in which the light module includes multiple conversion layers, additional reflective layers may be added between various conversion layers to prevent the reabsorption of converted light.

In operation, the conversion layer of various embodiments may be configured to convert incoming light of a first wavelength into outgoing light of a second wavelength. For example, in some embodiments, the incoming light may be converted from a shorter wavelength to outgoing light of a longer wavelength. Light conversion is not limited to single wavelengths, but may include a distribution of wavelengths of the incoming and outgoing light. Thus, various embodiments are directed to methods for converting modifying the wavelength of light by contacting a conversion layer as described with light. In various embodiments, light from the light source 130 is used to irradiate the conversion layer, and nanocrystals or quantum dots embedded in the conversion layer absorb the light from the light source and emit light at a different wavelength. For example, in some embodiments the light source may provide blue light of a single wavelength distribution. The conversion layer may include nanocrystals that absorb blue light and emit light of various different wavelengths to produce light having multiple colors. Thus, a single wavelength source can provide an spectral array of colors. In particular embodiments, incoming blue light of a single wavelength distribution can be converted to multiple wavelength distributions of green and red light, and such a light module can be used to produce a color display. In still other embodiments, near infrared (NIR) light sources may be converted to mid-infrared (MIR) for through air transmission, which can be useful for personnel and vehicle identification.

Certain embodiments are directed to modules that are arranged to reduce readsorption. Reabsorption refers to a process whereby light emitted by a nanocrystal or quantum dot is absorbed by other nanocrystal or quantum dot inside the conversion layer, which leads to a reduction in overall efficiency. The reabsorbed light is then either emitted by the second nanocrystal or quantum dot or converted to heat. Reabsorption occurs in many conventional fluorescent materials as well as in in quantum dots. The fraction of photons absorbed by a quantum dot that are then emitted at longer wavelengths is governed by the quantum dot's quantum efficiency. For example, a quantum efficiency of 85% means that 85% of the absorbed photons are converted to the emission spectrum for that quantum dot and 15% of the absorbed photons are converted to heat. Overall optical efficiency is the product of the quantum efficiency and the ratio of the absorbed wavelength over the emitted wavelength.

Quantum dots do not absorb wavelengths longer than their emission wavelength, and the strength of absorption of wavelengths equal to shorter than the QD emission wavelength increases as the difference between the excitation and emission wavelengths increases. The arrangement of nanocrystals emitting different wavelengths of light may reduce or minimize reabsorption of the light by excluding short wavelength emitted light regions producing long wavelength emitted light. Therefore, in some embodiments, multiple conversion layers containing light modules can be arranged from longest wavelength to shortest wavelength so that as light passes from the backplane near the light source through the light module with minimal reabsorption.

In some embodiments, light modules having the layered structure described above may be incorporated into a liquid crystal display (LCD). Because input light for LCD must be polarized, roughly half of the light leaving the light module is reflected upon entering the LCD. This implies that a significant portion of the light is making multiple passes through the cavity between the light module and the LCD. Reducing the probability of light having wavelengths shorter than the emission wavelength of quantum dots in the conversion layer, other than that portion of the blue that is to be converted, should improve the overall efficiency of the light module. Thus, in some embodiments, a coating capable of reflecting light reflected from the LCD back away from the light module may be provided on the light module. This prevents green light reflected from the LCD from passing though the red QD layer and the red from striking the light source. In other embodiments, multiple coatings may be provided that block light having longer wavelengths from entering a particular conversion layer may be interspersed between conversion layers in a multi-conversion layer device.

The reflective and antireflective layers described above may be incorporated into the light modules of various embodiments as a separate layer that is sandwiched between the conversion layers, or in other embodiments, the reflective and antireflective layers may be applied as coatings onto a substrate or conversion layer during preparation of the light module. In still other embodiments, the various reflective and antireflective layers may be combined to form a substrate that is incorporated into the light module. Reflective and antireflective coatings are well known in the art and any such coatings can be used in embodiments of the invention.

Reabsorption can also occur among nanocrystals the emit at the same wavelength. For example, red light can be absorbed by a red quantum dot and then emitted as a longer wavelength of red light causing a red shift of the overall spectrum. Substrates that include texturing or other treatments that direct blue light to travel nearly in the plane of the conversion layer may decrease reabsorption by increasing the optical path length of the blue light, which in turn increases the ratio of blue to red absorption. Alternatively, injection of blue light into one or more edge of the conversion layer can achieve a similar effect; however, it is very difficult to achieve uniform emission spectra with edge coupling.

In still further embodiments, the concentration of nanocrystals can be reduced by providing a photonic coupling structure that introduces light into the conversion layer at large angles. The increased optical path length for the light can be leveraged to reduce the concentration of the quantum dots in the conversion layer. For example, introducing blue light into a conversion layer at, for example, a 45° angle by passing the light through a diffusion layer directly or indirectly coupled to the conversion layer can be used to reduce the quantum dot concentration by up to about 30%.

Further embodiments are directed to methods for preparing the light modules described above. Such methods, generally, include the steps of filling a gap between two substrate layers or a between a substrate layer and a second none substrate layer with a liquid that includes a matrix material and nanocrystals or quantum dots and curing the liquid to create a conversion layer. In some embodiments, such methods may include the steps of providing a two parallel substrates with a gap between the parallel substrates. In particular embodiments two or more edges of the parallel substrates can be sealed, and in some embodiments, three edges can be sealed. In certain embodiments, a jig or chuck may be used to properly position the parallel substrates. For examples, a vacuum chuck having parallel walls may be used to position the parallel substrates. The liquid matrix material and nanocrystals can then be introduced into the gap formed between the parallel substrates to produce the conversion layer. Such vacuum chucks can hold the substrate rigidly against the chuck wall while the conversion matrix is added and holding the spacing between the substrates at a fixed distance during the curing process. The space between the substrate sheets can be sealed on three sides so that filling occurs by gravity and capillary action. In some embodiments, curing can be carried out at a temperature below the melting point of the substrate or the wall of the curing chamber in the case of free standing films. In such embodiments, no significant amount of gas is created or trapped within the matrix during the cure process.

In other embodiments, the nanocrystals can be applied to the substrate by a printing process, and in some embodiments, printing may allow for the creation of patterned conversion layers.

The conversion layers described above may be prepared from any nanocrystal or quantum dot known in the art, and such conversion layers can be incorporated into light modules that include any of the features described above. In particular embodiments, the nanocrystals and quantum dots used in the conversion layers described above may have an inorganic coating. In such embodiments, the nanocrystals and quantum dots may include a semiconductor nanocrystal defining an outermost surface and an inorganic coating covering the outermost surface of the nanocrystal.

Nanocrystals and quantum dots heretofore described must include organic components such as, organic ligands, that bind to an outermost surface of the nanocrystal. These organic ligands passivate the nanocrystal and provide an environment in which the nanocrystal can fluoresce. Removing the organic layer renders the nanocrystal or quantum dot unable to fluoresce, and therefore, unsatisfactory for its intended purpose.

In various embodiments, the nanoparticles may include an inorganic coating that includes less than about 30% organic components, less than 20%, less than 10%, less than 5%, or less than 1% organic components, and in certain embodiments, the inorganic coating may include substantially no organic components, which may encompass 0% or very near 0% organic components. The inorganic coating of such embodiments may bind directly to the outermost surface of the nanocrystal, and in particular embodiments, the inorganic coating may provide a passivation layer or the outermost surface of the nanocrystal.

While not wishing to be bound by theory, nanocrystals and quantum dots having an inorganic coating may provide sufficient fluorescence for any purpose currently practiced using the organic ligand coated nanoparticles, but not limited to, biological applications as, for example, signaling molecules. In addition, nanocrystals and quantum dots having an inorganic coating exhibit significantly improved fluorescence and improved fluorescence half-life when compared to quantum dots having an organic coating. For example, in some embodiments, the fluorescence half-life of nanocrystals and quantum dots having an inorganic coating may be greater than 15,000 hours, greater than 20,000 hours, greater than 25,000 hours, greater than 30,000 hours, greater than 35,000 hours, or greater than 40,000 hours without significant loss of fluorescence. Therefore, nanocrystals and quantum dots having an inorganic coating may have a useful life of at least 30,000 hours to greater than 100,000 hours making these nanocrystals particularly for applications in which the particle longevity is important for light modules and LEDs such as those described above.

EXAMPLES

Example 1: Preparation of CdSe/ZnS Nanocrystals

A CdO powder (1.6 mmol, 0.206 g) is mixed with oleic acid (6.4 mmol, 1.8 g) in 40 mL of trioctylamine (TOA). The mixed solution is thermally treated at 150° C. with rapid stirring and is then heated to 300° C. under a stream of $N_2$ gas. Next, 0.2 mL of trioctylphosphine containing 2.0 M Se is rapidly introduced into the Cd-containing mixture at 300° C. After 90 seconds, 1.2 mmol of n-octanethiol in TOA (210 μl in 6 mL) is injected at a rate of 1 mL/min using a syringe pump. The mixture is allowed to react for 40 minutes. Nanocrystal formation was monitored by standard methods (achieving a desired fluorescence emission wavelength) until CdSe cores of the desired particle size was obtained, and the reaction was then cooled to room temperature.

The CdSe cores obtained above were washed by adding toluene, 1-butanol (BuOH) and acetonitrile to precipitate nanocrystal cores; all solvents were carefully dried to ensure they were anhydrous, and the operations were conducted under inert atmosphere. The mixture was centrifuged, and the pellet was collected. A small amount of toluene was added to the pellet, then BuOH was added, and the mixture was again centrifuged. The pellet was collected and was dispersed in hexanes.

The CdSe cores were treated as follows to grow a ZnS shell on the core. To a reaction flask under inert atmosphere, 4.3 mL 1-octadecene (ODE), 238.5 mg of oleic acid, and 77.5 mg zinc acetate were added. The mixture was heated to 260° C. and was then cooled to 80° C. While at 80° C., 4.9 mL of the washed CdSe cores prepared above, dispersed in n-hexanes, at an OD of 6.56, were added. The flask was placed under vacuum to remove hexane. The contents of the flask were then heated to 265° C. A 0.33 M solution of sulfur in oleylamine was prepared by adding 14.0 mg of sulfur to 1.04 g oleylamine. At 265° C. the sulfur solution was slowly added dropwise over a period of 75 minutes. After 75 minutes, 5.5 mL of trioctylphosphine (TOP) at room temperature was added to the reaction flask. The product is a population of quantum dots that are soluble in hydrophobic solvents (e.g., hexane, toluene, and the like) and stable for months. The product has an initially high quantum yield of about 50%, and loses less than 15% of its quantum yield when dissolved in hexanes or when modified by known methods to coat it with AMP and dispersed in water.

Example 2: Capping CdSe/Zns with Organic Molecules

The CdSe/ZnS core-shell nanocrystals were synthesized in a mixture of octyldecene and oleic acid. The nanocrystals were then precipitated with methanol and dried. The nanocrystals were then resuspended in 100% heptyl acetate. The nanocrystals obtained had a first coating layer of oleic acid and a second coating layer of heptyl acetate intercalated between the non-polar chains of oleic acid.

The method was carried out as follows. Oleic acid in DMF solution (40% wt/wt, 0.3 mL) was added to the CdSe/ZnS nanocrystals and stirred vigorously overnight. The nanocrystals were now capped with oleic acid. The excess oleic acid was removed by precipitation by acetonitrile followed by ultra-centrifugation. The CdSe/ZnS nanocrystals coated with oleic acid was further added, in high concentrations, to 100% heptyl acetate solution. The nanoparticles obtained had a first coating layer of oleic acid and a second coating layer of heptyl acetate intercalated between the non-polar chains of oleic acid.

Example 3: A Polymer Film with CdSe/ZnS Nanocrystals

CdSe/ZnS nanocrystals with oleic acid surface ligand were prepared as in Example 2. The nanocrystals were mixed in heptyl acetate solution at a concentration of 100 mg/mL to obtain CdSe/ZnS nanocrystals with oleic acid/heptyl acetate coatings. About 100 mL of these nanocrystals were added to 5 mL of 10% (w/v) solution of polymethyl methacrylate (PMMA) (mw 25,000) in toluene and mixed well. The solution was poured to cover an area of 100 cm sq on an acrylic sheet and left to dry in oven at 80° C. for 1 hour.

Example 4: A Polymer Film with CdSe/ZnS Nanocrystals

CdSe/ZnS nanocrystals with oleic acid surface ligand were prepared as in Example 2. The nanocrystals were mixed in heptyl acrylate solution at a concentration of 100 mg/mL to obtain CdSe/ZnS nanocrystals with oleic acid/heptyl acetate coatings. An acrylic mixture of 90% difunctional acrylic oligomer (viscosity of 30,000-60,000 cP at RT) and 10% pentaerythritol tetraacrylate was prepared and about 0.2% (w/w) UV photoinitiator was added to the acrylic mixture. About 100 μL of the above prepared nanocrystal was added to 5 mL of the acrylic+photoinitiator mixture and mixed well. The mixture was sonicated for 1 minute to remove bubbles and later poured on a glass plate having an area of 100 cm sq. The mixture was cured using a UV lamp (25 mW) for 1 minute.

What is claimed is:
1. A nanoparticle comprising:
   a semi-conductor nanocrystal, wherein the semi-conductor nanocrystal is a concentration-gradient quantum dot;
   a first organic coating layer comprising one or more lipophilic carboxylic acid ligand having a polar head and a non-polar tail, with the polar head contacting the nanocrystal;
   a second organic coating comprising an organic material having a polar head and a non-polar tail, wherein the non-polar tail of the second organic coating is intercalated with the non-polar tail of the first coating layer, wherein the polar head of the organic material in the second coating layer is acrylate, methacrylate, cyanoacrylate, anhydride, alkyl, epoxy, isocyanate, acetate, phenolic group, carboxyl, thioester, amide, sulfhydryl, or hydroxyl.

2. The nanoparticle of claim 1, wherein the one or more lipophilic carboxylic acid ligands is selected from $C_3$-$C_{24}$ fatty acid ligands.

3. The nanoparticle of claim 2, wherein the $C_3$-$C_{24}$ fatty acid ligands are selected from saturated hydrocarbons, monounsaturated hydrocarbons, or polyunsaturated hydrocarbons.

4. The nanoparticle of claim 2, wherein the fatty acid ligand is selected from oleic acid, butyric acid, caproic acid, caprylic acid, capric acid, lauric acid, myristic acid, palmitic acid, margaric acid, stearic acid, arachidic acid, behenic acid, lignoceric acid, myristoleic acid, palmitoleic acid, gadoleic acid, erucic acid, nervonic acid, linoleic acid, linolenic acid, parinaric acid, aracidonic acid, timnodonic acid, brassic acid, and clupanodonic acid.

5. The nanoparticle of claim 1, wherein the ratio of the organic molecule of the second coating layer to the organic molecule of the first coating layer is about 1:1 to about 100.

6. The nanoparticle of claim 1, wherein the ratio of the organic molecule of the second coating layer to the organic molecule of the first coating layer is selected from about 1:1, about 1:2, about 1:3, about 1:4, about 1:5, about 1:6, about 1:7, about 1:8, about 1:9, about 1:10, about 1:20, about 1:30, about 1:40, about 1:50, about 1:60, about 1:70, about 1:80, about 1:90, or about 1:100.

7. The nanoparticle of claim 1, wherein, about 40% to about 100% of the organic molecules in the second coating layer may be intercalated in the first coating layer.

8. The nanoparticle of claim 1, wherein the concentration-gradient quantum dot is an alloyed 2-6-6 SCN having the formula $WY_xZ_{(1-x)}$, where W is a Group II element, Y and Z are different Group VI elements, and $0<X<1$.

9. The nanoparticle of claim 1, wherein the concentration-gradient quantum dot is selected from alloys of CdSeTe having a molecular formula $CdS_{1-x}Te_x$, CdSSe having a molecular formula $CdS_{1-x}Se_x$, CdSTe having a molecular formula $CdS_{1-x}Te_x$, ZnSeTe having a molecular formula $ZnSe_{1-x}Te_x$, ZnCdTe having a molecular formula $Zn_{1-x}Cd_xTe$, CdHgS having a molecular formula $Cd_{1-x}Hg_xS$, HgCdTe having a molecular formula HgCdTe, InGaAs having a molecular formula InGas, GaAlAs having a molecular formula GaAlAs, or InGaN having a molecular formula InGaN, where x in each example can be any fraction between 0 and 1.

10. A device comprising:
plurality of nanoparticles, each nanoparticle comprising a semi-conductor nanocrystal, a first organic coating layer comprising one or more lipophilic carboxylic acid ligand having a polar head and a non-polar tail, with the polar head contacting the semi-conductor nanocrystal, and a second organic coating comprising an organic material having a polar head and a non-polar tail, wherein the non-polar tail of the second organic coating is intercalated with the first coating layer; and
a polymer matrix in which the plurality of nanoparticles are embedded; and
wherein the semi-conductor nanocrystal is a concentration-gradient quantum dot.

* * * * *